(12) United States Patent
Koelmel et al.

(10) Patent No.: US 7,985,945 B2
(45) Date of Patent: Jul. 26, 2011

(54) METHOD FOR REDUCING STRAY LIGHT IN A RAPID THERMAL PROCESSING CHAMBER BY POLARIZATION

(75) Inventors: Blake Koelmel, Mountain View, CA (US); Joseph Michael Ranish, San Jose, CA (US); Aaron Hunter, Santa Cruz, CA (US)

(73) Assignee: Applied Materials, Inc., Santa Clara, CA (US)

( * ) Notice: Subject to any disclaimer, the term of this patent is extended or adjusted under 35 U.S.C. 154(b) by 596 days.

(21) Appl. No.: 12/118,497

(22) Filed: May 9, 2008

(65) Prior Publication Data

US 2009/0277894 A1    Nov. 12, 2009

(51) Int. Cl.
*A21B 1/00* (2006.01)
*F26B 3/30* (2006.01)

(52) U.S. Cl. ........ 219/409; 219/405; 219/411; 219/390; 219/121.6; 219/121.74; 219/121.78; 219/121.82; 118/724; 118/725; 118/50.1; 392/416; 392/418

(58) Field of Classification Search .................. 219/390, 219/405, 411, 121.6–121.66, 121.74–121.78, 219/121.82; 118/724, 725, 50.1; 392/416, 392/418

See application file for complete search history.

(56) References Cited

U.S. PATENT DOCUMENTS

| | | | |
|---|---|---|---|
| 5,154,512 A | 10/1992 | Schietinger et al. | |
| 6,179,466 B1 | 1/2001 | Peuse et al. | |
| 6,835,914 B2 | 12/2004 | Timans | |
| 7,015,422 B2 * | 3/2006 | Timans | 219/390 |
| 7,056,389 B2 | 6/2006 | Hauf et al. | |
| 7,109,443 B2 | 9/2006 | Knutson et al. | |
| 7,135,656 B2 | 11/2006 | Timans | |
| 7,226,488 B2 | 6/2007 | Gat | |
| 7,269,343 B2 | 9/2007 | Koren et al. | |
| 7,358,462 B2 | 4/2008 | Timans | |
| 2006/0289434 A1 | 12/2006 | Timans | |

* cited by examiner

*Primary Examiner* — Shawntina Fuqua
(74) *Attorney, Agent, or Firm* — Patterson & Sheridan, L.L.P.

(57) ABSTRACT

Embodiments of the present invention provide apparatus and method for reducing noises in temperature measurement during thermal processing. One embodiment of the present invention provides a chamber for processing a substrate comprising a chamber enclosure defining a processing volume, an energy source configured to direct radiant energy toward the processing volume, a spectral device configured to treat the radiant energy directed from the energy source towards the processing volume, a substrate support disposed in the processing volume and configured to support the substrate during processing, and a sensor assembly configured to measure temperature of the substrate being processed by sensing radiation from the substrate within a selected spectrum.

25 Claims, 6 Drawing Sheets

METHOD FOR REDUCING STRAY LIGHT IN A RAPID THERMAL PROCESSING CHAMBER BY POLARIZATION

BACKGROUND OF THE INVENTION

1. Field of the Invention

The present invention generally relates to the field of semiconductor processing. More particularly, the present invention relates to methods and apparatus for thermally processing a semiconductor substrate.

2. Description of the Related Art

During semiconductor processing, substrates may be heated to high temperatures so that various chemical and/or physical reactions can take place. Thermal processes are usually used to heat the substrates. A typical thermal process, such as annealing, requires providing a relatively large amount of thermal energy to the substrate in a short amount of time, and thereafter rapidly cooling the wafer to terminate the thermal process. Examples of thermal processes currently in use include Rapid Thermal Processing (RTP) and impulse (spike) annealing.

In general, these thermal processes heat the substrates under controlled conditions according to a predetermined thermal recipe. These thermal recipes fundamentally consist of a temperature that the semiconductor substrate is heated to the rate of change of temperature, i.e., the temperature ramp-up and ramp-down rates and the time that the thermal processing system remains at a particular temperature.

Accurate temperature measurement is essential to control the process to achieve desired result and to maintain uniformity across the substrate during thermal processing. Temperature measurement of substrates being processed or chamber components is usually conducted in-situ by non-contact methods, such as using pyrometers to sense radiation energy from the target objects. A pyrometer generally detects energy level of a certain wavelength of radiant energy from the target objects to determine temperature of the target objects.

Accuracy of temperature measurement by pyrometers during thermal processing is usually affected by noises received in the radiant energy. For example, when measuring a temperature of a substrate being processed, radiant energy from the energy source may be directly or through reflection received by the sensor in addition to the radiant energy emitted by the substrate. As a result, covers and shields are used to prevent background noises, such as radiation from the energy source, from entering the sensor. However, the covers and shields not only increase system complexity, reduce system flexibility, but also limit the lower range of the sensors.

Therefore, there is a need for improved apparatus and methods for accurate temperature measurement during thermal processing.

SUMMARY OF THE INVENTION

Embodiments of the present invention generally provide apparatus and methods for accurate temperature measurement during thermal processing. Particularly, embodiments of the present invention provide apparatus and method for reducing noises in temperature measurement during thermal processing.

One embodiment of the present invention provides a chamber for processing a substrate comprising a chamber enclosure defining a processing volume, an energy source configured to direct radiant energy toward the processing volume, a spectral device configured to treat the radiant energy directed from the energy source towards the processing volume, a substrate support disposed in the processing volume and configured to support the substrate during processing, and a sensor assembly configured to measure temperature of the substrate being processed by sensing radiation from the substrate within a selected spectrum.

Another embodiment of the present invention provides a rapid thermal processing chamber comprising a chamber enclosure defining a processing volume, wherein the chamber enclosure comprises an energy window transparent to radiant energy, an energy source disposed outside the chamber enclosure, wherein the energy source is configured to direct radiant energy towards the processing volume through the energy window, a source polarizer configured to polarize the radiant energy directed from the energy source towards the processing volume along a first direction, a substrate support disposed in the processing volume and configured to support a substrate during processing, a sensor assembly configured to measure an attribute of one or more components disposed in the processing volume by sensing radiant energy from the one or more components, and a sensor polarizer configured to polarize radiant received by the sensor assembly along a second direction substantially perpendicular to the first direction.

Yet another embodiment of the present invention provides a method for processing a substrate comprising positioning the substrate in a processing volume of a thermal processing chamber having an energy source configured to direct radiant energy towards the processing volume, marking the radiation energy directed from the energy source to the processing volume, and measuring an attribute of a component within the processing volume by sensing radiation energy from the component and eliminating marked radiation energy from the energy source using a sensor assembly.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention provide apparatus and method for reducing noises in temperature measurement during thermal processing. In one embodiment of the present invention, radiant energy from source other than a target object is marked prior to being received a sensor configured to measure temperature of the target object, and the sensor measures temperature according to unmarked radiant energy. In one embodiment, marking of the radiant energy comprises one of a polarizing at least a selected spectrum of the radiant energy, reflecting a selected spectrum of the radiant energy, absorbing a selected spectrum of the radiant energy, or combinations thereof.

Figure 1:
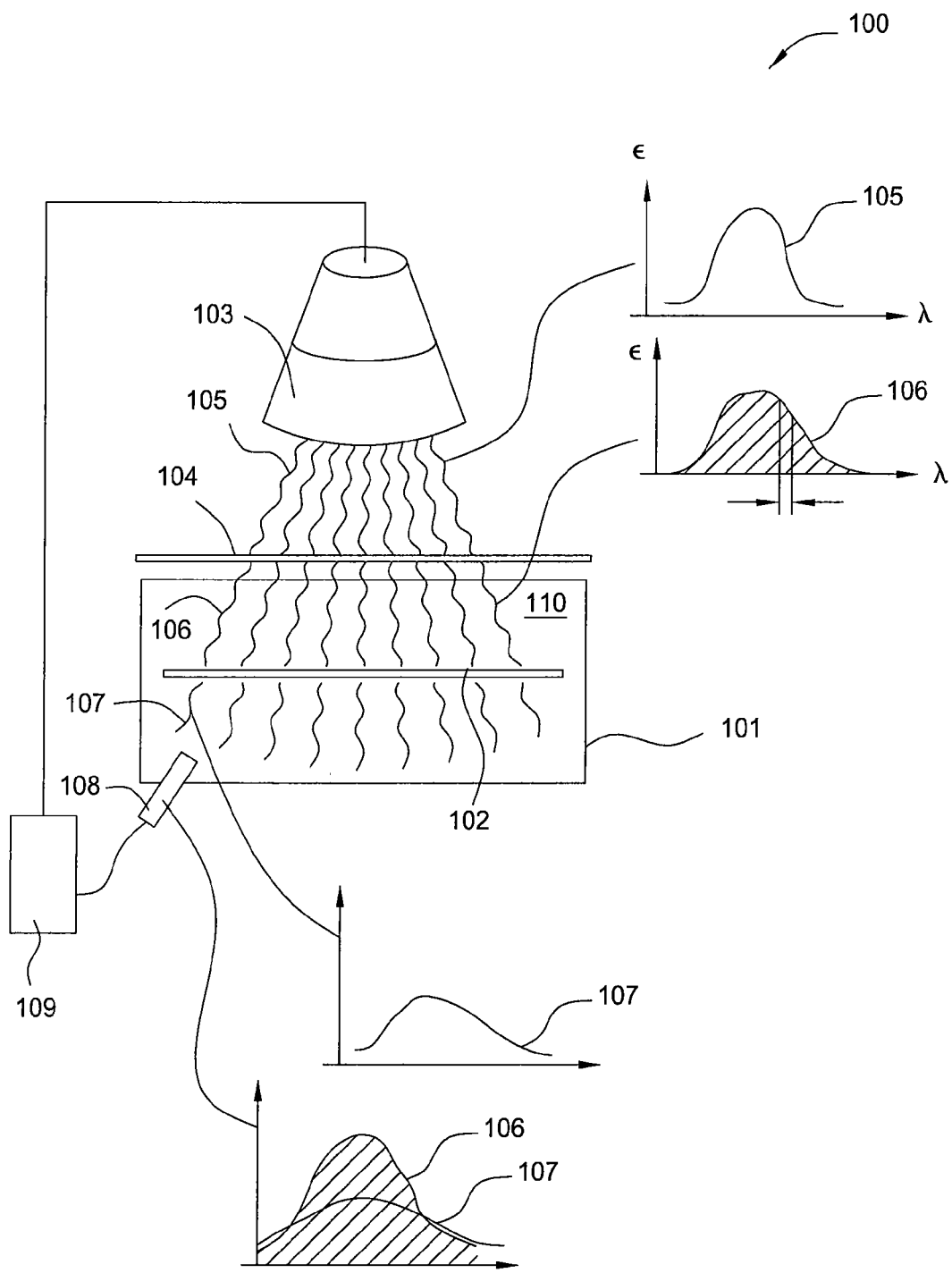
FIG. 1 is a schematic view of a thermal processing chamber in accordance with one embodiment of the present invention.

FIG. 1 is a schematic view of a thermal processing chamber 100 in accordance with one embodiment of the present invention. The processing chamber 100 generally comprises a chamber body 101 defining a processing volume 110 in which a substrate 102 may be thermally processed. An energy source 103 is disposed outside the chamber body 101 and is configured to direct radiant energy 105 towards the processing volume 110 through a window 104. A sensor 108 is disposed in position to measure an attribute of components in the interior of the chamber body 101. In one embodiment, the sensor 108 is configured to measure temperature of the substrate 102 by obtaining and measuring radiant energy from the substrate 102. The sensor 108 may be connected to a system controller 109, which may be used to adjust the energy source 103 according to the measurement from the sensor 108.

In one embodiment, the radiant energy 105 from the energy source 103 may be treated or marked prior to or while entering the processing volume 110 as radiant energy 106. As a result, the sensor 108 may be able to distinguish and/or separate radiant energy 107 originated from target objects, such as the substrate 102, from the radiant energy 106 during processing.

The radiant energy 105 may be treated via polarization, reflection, absorption, or combinations thereof. The radiant energy 105 from the energy source 103 may be treated across the entire spectrum, or only a selected spectrum of the radiant energy 105 is treated.

In one embodiment, the radiant energy 105 may be treated at a selected spectrum which covers a working wavelength used for measuring the radiant energy from a target, such as the substrate 102. In another embodiment, the radiant energy 105 may be treated at a reference spectrum which does not cover a working wavelength used for measuring the radiant energy from a target, such as the substrate 102.

In one embodiment, the radiant energy 105 may be polarized along a first direction upon entering the processing volume 110. Polarization may be achieved using a source polarizer disposed in front the energy source 103, inside or outside the window 104. The source polarizer may be configured to polarize at least the selected spectrum of the radiant energy 105. A sensor polarizer may be used to polarize the radiant energy received by the sensor 108. The sensor polarizer is configured to polarize along a direction substantially perpendicular to the direction of the source polarizer so that the polarized radiant energy 106 is blocked from the sensor 108. As a result, only radiant energy 107 from the substrate 102 is received and measured by the sensor 108. The source and sensor polarizer may be configured to polarize the entire spectrum of the radiant energy or to polarize a selected spectrum to cover a narrow bandwidth where the sensor 108 operates.

In another embodiment, treating the radiant energy 105 comprises substantially removing a selected spectrum or a narrow bandwidth that includes working wavelength of the sensor 108 so that the radiant energy 106 does not contain wavelength sensible to the sensor 108.

In another embodiment, removing the selected spectrum of the radiant energy 105 may be performed by absorption. In one embodiment, one or more thin film filters may be formed on the window 104 to absorb the selected spectrum of radiant energy 105.

Figure 2:
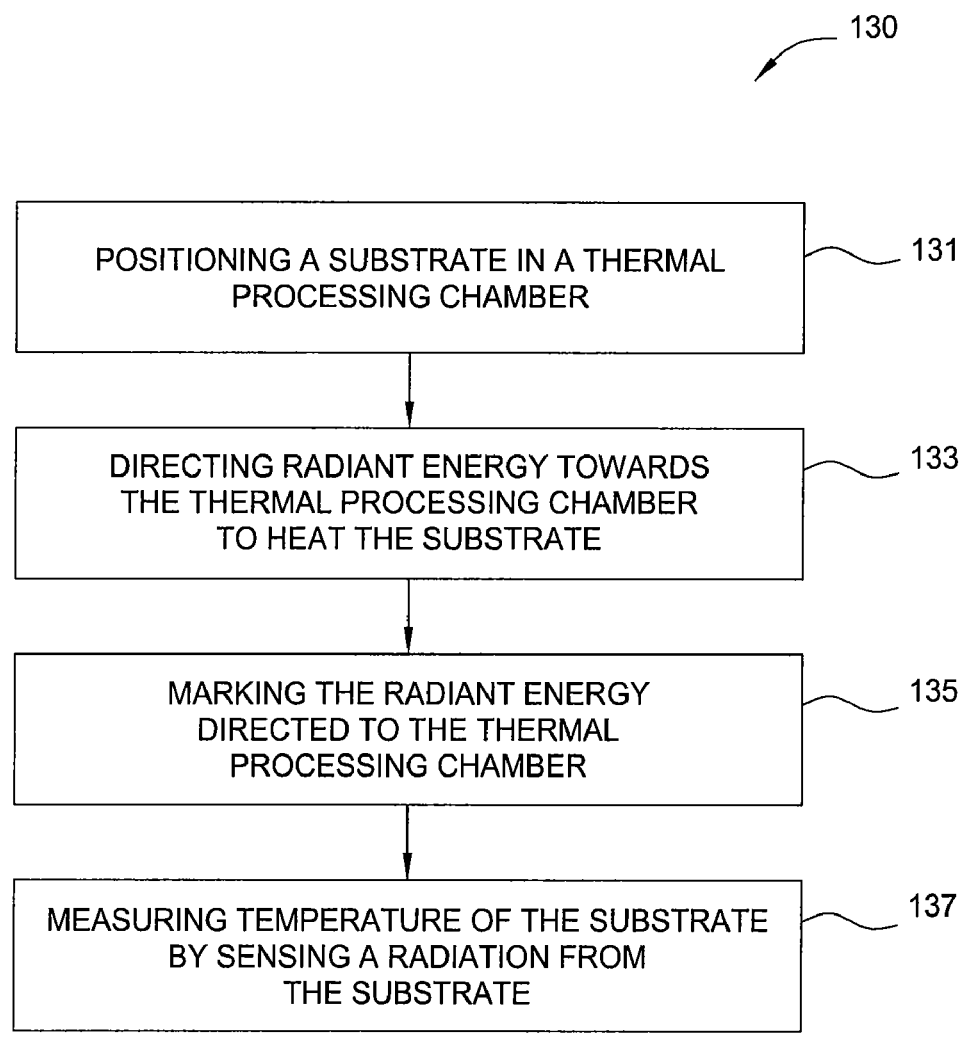
FIG. 2 is a flow chart showing a method for measuring temperature during thermal processing in accordance with one embodiment of the present invention.

FIG. 2 is a flow chart showing a method 130 for measuring temperature during thermal processing in accordance with one embodiment of the present invention. The method 130 may be performed in a processing chamber similar to the processing chamber 100 of FIG. 1.

In step 131, a substrate to be processed is positioned in a thermal processing chamber.

In step 133, radiant energy from an energy source is directed into the thermal processing chamber to heat the substrate.

In step 135, the radiant energy from the energy source is marked upon entering the processing chamber. Marking of the radiant energy may comprise one of polarizing, reflecting, absorbing, or combinations thereof. The radiant energy form the energy source may be marked across the spectrum or within a selected spectrum.

In step 137, temperature of the substrate is measured using a sensor configured to sense a radiation from the substrate. The sensor is configured to remove or avoid the marked radiant energy from the energy source during operation.

Figure 3:
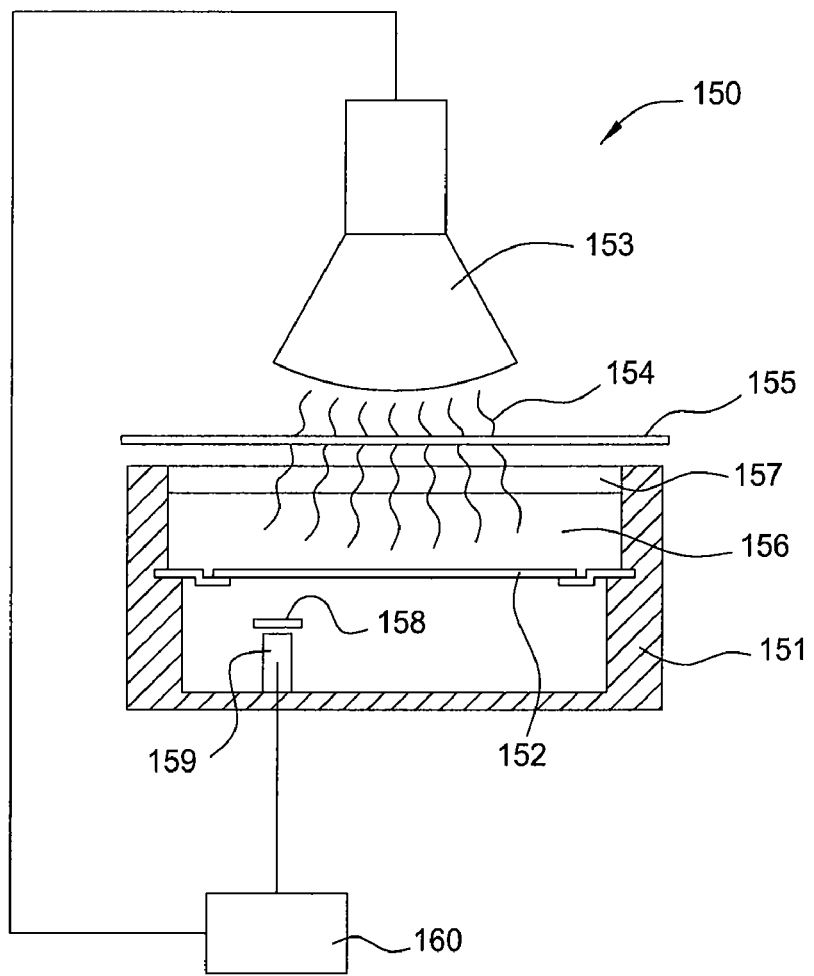
FIG. 3 is a schematic view of a thermal processing chamber in accordance with one embodiment of the present invention.

FIG. 3 is a schematic view of a thermal processing chamber 150 in accordance with one embodiment of the present invention. The processing chamber 150 generally comprises a chamber body 151 defining a processing volume 156 in which a substrate 152 may be thermally processed.

An energy source 153 is disposed outside the chamber body 151 and is configured to direct radiant energy 154 towards the processing volume 156 through a source polarizer 155 and a window 157. A sensor 159 is disposed in position to measure to measure temperature of the substrate 152 by obtaining and measuring radiant energy from the substrate 152. A sensor polarizer 158 is adapted to polarize any radiation received by the senor 159. The sensor polarizer 158 and the source polarizer 155 are configured to polarize along directions substantially perpendicular to one another. Therefore, radiant energy from the energy source 153 is blocked from the sensor 159 after two polarizations.

The source polarizer 155 may be configured to polarize at least the selected spectrum of the radiant energy 154. To avoid energy loss from polarization, the source polarizer 155 may be configured to polarize only a selected spectrum of the radiant energy 154 from the energy source 153. The selected spectrum is generally wide enough to cover the range of wavelength that the sensor 159 operates. In one embodiment, the senor 159 may be configured to measure radiation with wavelength of about 920 nm, and the selected spectrum comprises a range of wavelength from about 840 nm to about 960 nm. The sensor polarizer 155 may be deposited on the window 157 or disposed near a reflector of the energy source 153.

The sensor polarizer 158 may be disposed right in front of a receiving end of the sensor 159. In another embodiment, particularly for narrow band polarizing, the sensor polarizer 158 may be deposited on the window 157 to prevent entry of the selected spectrum of radiant energy 154 to the processing volume 156, thus, prevent entry to the sensor 159.

The sensor 159 may be connected to a system controller 160, which may be used to adjust the energy source 153 according to the measurement from the sensor 159.

In another embodiment, a polarizer may be positioned on other radiation source of the processing chamber 150, such as chamber walls and substrate support, whose radiant energy may affect precise measurement of the senor 159.

Figure 4:
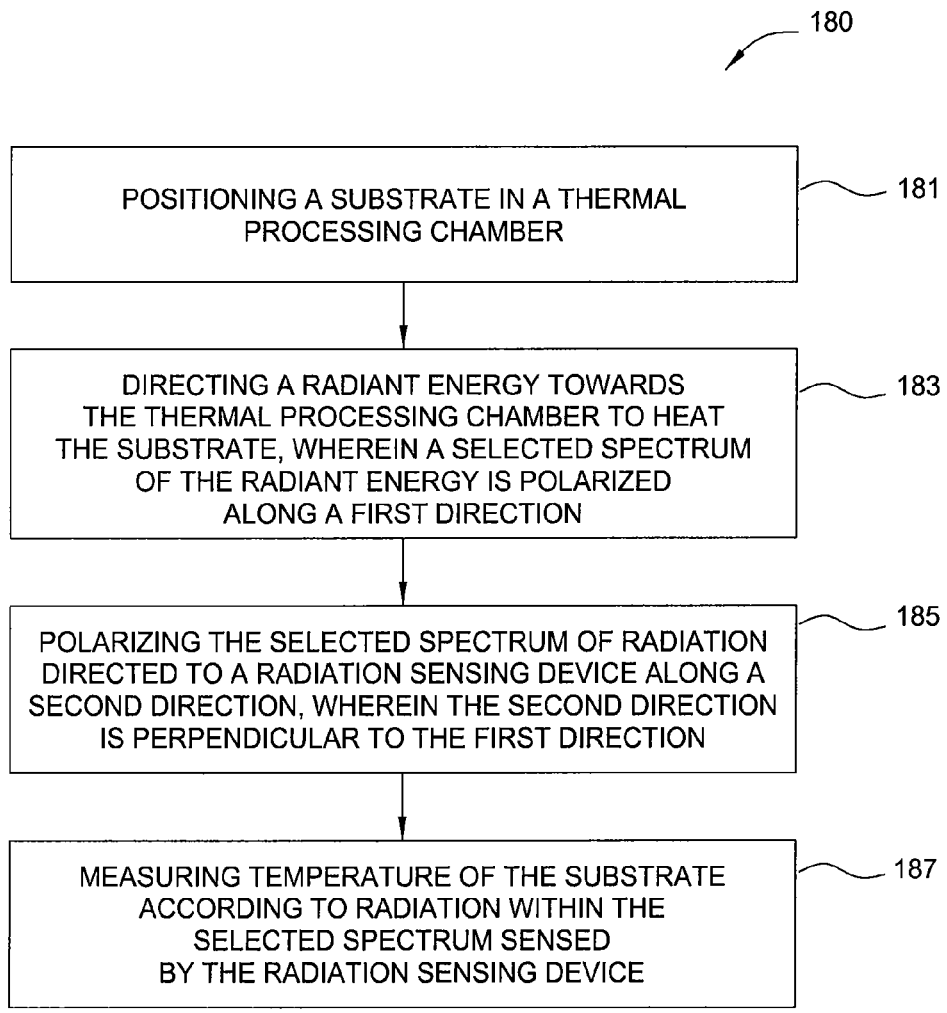
FIG. 4 is a flow chart showing a method for measuring temperature during thermal processing in accordance with one embodiment of the present invention.

FIG. 4 is a flow chart showing a method 180 for measuring temperature during thermal processing in accordance with one embodiment of the present invention. The method 180 may be performed in a processing chamber similar to the processing chamber 150 of FIG. 3.

In step 181, a substrate to be processed is positioned in a thermal processing chamber.

In step 183, at least a selected spectrum of radiant energy from an energy source is polarized along a first direction and directed into the thermal processing chamber to heat the substrate.

In step 185, the polarized radiant energy from the energy source is further polarized along a second direction prior to entry to a sensor. The second direction is substantially perpendicular to the first direction.

In step 187, temperature of the substrate is measured using the sensor configured to sense a radiation from the substrate.

Figure 5:
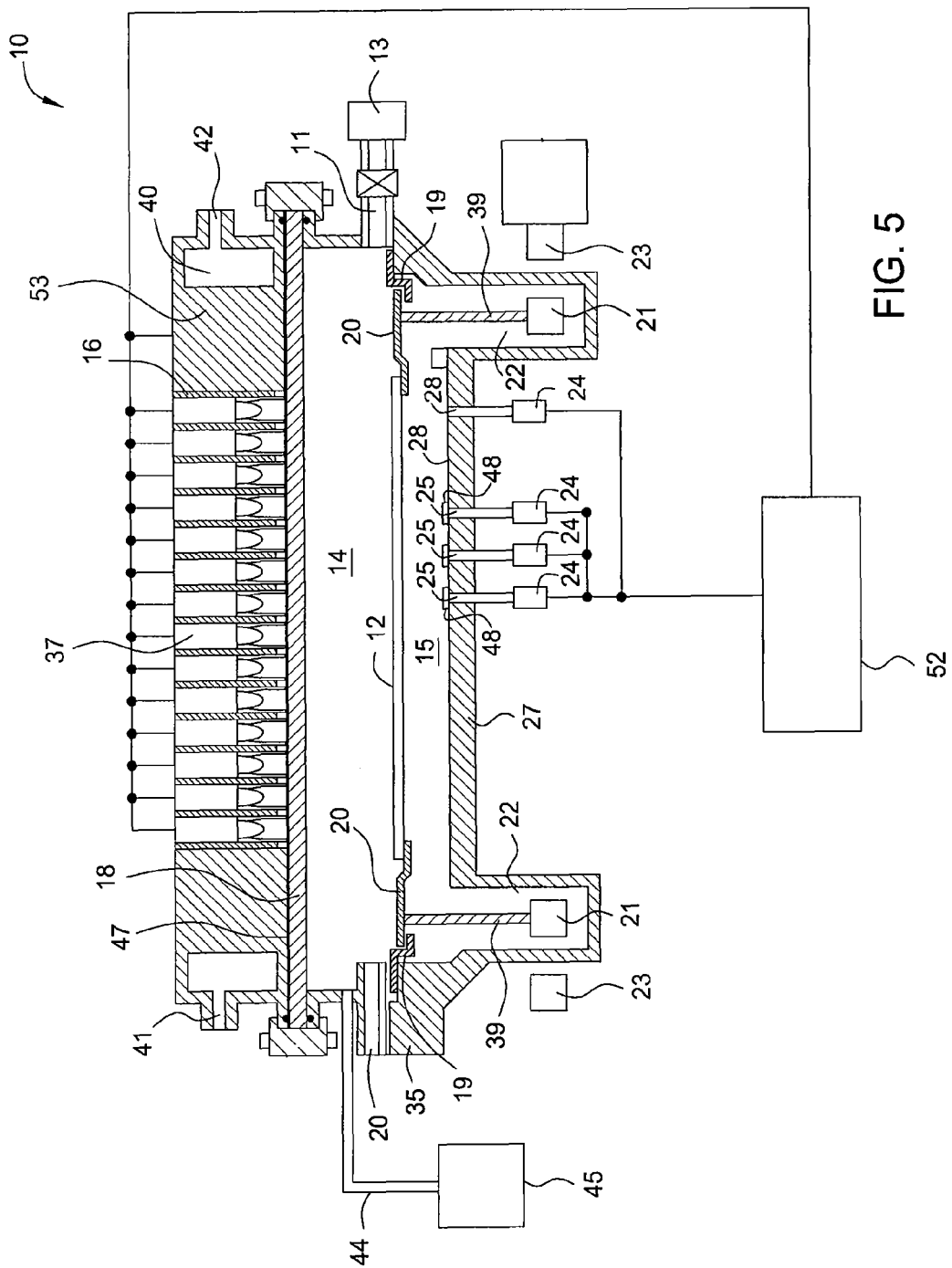
FIG. 5 is a schematic sectional side view of a rapid thermal processing chamber in accordance with one embodiment of the present invention.

FIG. 5 schematically illustrates a sectional view of a rapid thermal processing system 10 in accordance with one embodiment of the present invention. The rapid thermal processing system 10 comprises a chamber body 35 defining a processing volume 14 configured for annealing a disk-shaped substrate 12 therein. The chamber body 35 may be made of stainless steel and may be lined with quartz. The processing volume 14 is configured to be radiantly heated by a heating assembly 16 disposed on a quartz window 18 of the rapid thermal processing system 10. In one embodiment, the quartz window 18 may be water cooled.

A slit valve 30 may be formed on a side of the chamber body 35 providing a passage for the substrate 12 to the processing volume 14. A gas inlet 44 may be connected to a gas source 45 to provide processing gases, purge gases and/or cleaning gases to the processing volume 14. A vacuum pump 13 may be fluidly connected to the processing volume 14 through an outlet 11 for pumping out the processing volume 14.

A circular channel 22 is formed near the bottom of the chamber body 35. A magnetic rotor 21 is disposed in the circular channel 22. A tubular riser 39 rests on or is otherwise coupled to the magnetic rotor 21. The substrate 12 is supported by a peripheral edge by an edge ring 20 disposed on the tubular riser 39. A magnetic stator 23 is located externally of the magnetic rotor 21 and is magnetically coupled through the chamber body 35 to induce rotation of the magnetic rotor 21 and hence of the edge ring 20 and the substrate 12 supported thereon. The magnetic stator 23 may be also configured to adjust the elevations of the magnetic rotor 21, thus lifting the substrate 12 being processed. Additional magnetic rotation and levitation information is available in the U.S. Pat. No. 6,800,833, which is hereby incorporated by reference.

The chamber body 35 may include a reflector plate 27 near the back side of the substrate 12. The reflector plate 27 has an optical reflective surface 28 facing the back side of the substrate 12 to enhance the emissivity of the substrate 12. In one embodiment, the reflector plate 27 may be water cooled. The reflective surface 28 and the back side of the substrate 12 define a reflective cavity 15. In one embodiment, the reflector plate 27 has a diameter slightly larger than the diameter of the substrate 12 being processed. For example, if the rapid thermal processing system 10 is configured to process 12 inch substrates, the diameter of the reflector plate 27 may be about 13 inches.

In one embodiment, an outer ring 19 may be coupled between the chamber body 35 and the edge ring 20 to separate the reflective cavity 15 from the processing volume 14. The reflective cavity 15 and the processing volume 14 may have different environments.

The heating assembly 16 may comprise an array of heating elements 37. The array of heating elements 37 may be UV lamps, halogen lamps, laser diodes, resistive heaters, microwave powered heaters, light emitting diodes (LEDs), or any other suitable heating elements both singly or in combination. The array of heating elements 37 may be disposed in vertical holes formed in a reflector body 53. In one embodiment, the heating elements 37 may be arranged in a hexagon pattern. A cooling channel 40 may be formed in the reflector body 53. A coolant, such as water, may enter the reflector body 53 from an inlet 41, travel adjacent the vertical holes cooling the array of heating elements 37, and exit the reflector body from an exit 42.

The array of heating elements 37 are connected to a controller 52 which are capable of adjusting heating effects of the array of heating elements 37. In one embodiment, the array of heating elements 37 may be divided into a plurality of heating groups to heat the substrate 12 by multiple concentric zones. Each heating group may be controlled independently to provide desired temperature profile across a radius of the substrate 12. Detailed descriptions of the heating assembly 16 may be found in U.S. Pat. Nos. 6,350,964 and 6,927,169, which are hereby incorporated by reference.

The rapid thermal processing system 10 further comprise a plurality of thermal probes 24 configured to measure thermal properties of the substrate 12 at different radial locations. In one embodiment, the plurality of thermal probes 24 may be a plurality of pyrometers optically coupled to and disposed in a plurality of apertures 25 formed in the reflector plate 27 to detect a temperature or other thermal properties of a different radial portion of the substrate 12. Detailed description of similar temperature probes may be found in the U.S. Pat. No. 5,755,511, which is hereby incorporated by reference. The plurality of thermal probes 24 are connected with the controller 52 which may conduct a closed loop control to adjust the power supplies to the array of heating elements 37 to provide a tailored radial thermal profile across the substrate 12. The pyrometers may measure more than one wavelength region and may measure a spectral power distribution.

In one embodiment, the quartz window 18 may have a polarizer 47 attached thereto. The polarizer 47 is configured to polarize radiant energy from the array of heating elements 37 so that the radiant energy from the array of heating elements 37 is polarized once entering the processing volume 14.

A polarizer 48 may be disposed near each of the plurality of thermal probes 24. The polarizer 48 is configured to polarize any light received by the corresponding thermal probes 24 along a direction substantially perpendicular to the polarizing direction of the polarizer 47. As a result, radiant energy from the array of heating elements 37, at least within the selected wavelength bands, will not enter the thermal probe 24. The plurality of thermal probes 24 measure temperature by sensing intensity of a radiation from a target object at a working wavelength. Since radiation from the plurality of heating elements 37 is blocked from the thermal probes 24 after polarization by the polarizer 47 and polarizer 48, accuracy of the measurement of the thermal probes 24 is improved.

In one embodiment, the polarizer 47 is configured to polarize light at selected wavelength bands. Exemplary band polarizer may be Polarcor™ polarizer by Corning and colorCol® polarizer by Codixx.

In another embodiment, other materials, such as crystals like tourmaline may be used in conjunction or in place of the quartz window 18 to polarize a selected spectrum of radiant energy directed to the processing volume 14.

In another embodiment, polarizer similar to the polarizer 47 may be formed in other locations, such as chamber walls, lamp bulbs, and reflector sleeves to achieve desired noise removal.

In one embodiment, the plurality of thermal probes 24 may be configured to measure radiation with wavelength of about 920 nm, and the polarizer 47 is configured to polarize lights in a band of wavelength from about 840 nm to about 960 nm.

During a rapid thermal process, the substrate 12 may be transferred to the processing volume 14 through the slit valve 30 and supported by the edge ring 20. The magnetic rotor 21 may rotate the substrate 12 and position the substrate 12 in a desired elevation. During most processes, the objective is to rapidly heat the substrate 12 uniformly to a target temperature. In one embodiment of the present invention, heat transfer to the substrate 12 mainly comes from radiation of the array of heating elements 37 and conduction and/or radiation from the edge ring 20 which is heated in a desired temperature. A uniform temperature profile across the substrate 12 may be achieved by controlling the array of heating elements 37 and by keeping the edge ring 20 at the desired temperature which is usually different than the target temperature for the substrate 12.

Controlling the array of heating element 37 may be conducted by measuring the temperature of the substrate 12 across a radius using the plurality of thermal probes 24. In one embodiment, the plurality of thermal probes 24 may be evenly distributed across the reflector plate 27 corresponding to a radius of the substrate 12. The measured temperatures from the plurality of thermal probes 24 are sampled by the controller 52. The controller 52 may used the measured temperatures to adjust the array of heating elements 37 so that the temperature across a radius of the substrate 12 becoming uniform. In one embodiment, the controller 52 may adjust the array of heating elements 37 by a plurality of concentric zones. Detailed descriptions of controlling heating elements by multiple zones may be found in U.S. Pat. No. 5,755,511 and U.S. patent application Ser. No. 11/195,395, published as United States Patent Application Publication No. 2006/0066193, which are hereby incorporated by reference.

Figure 6:
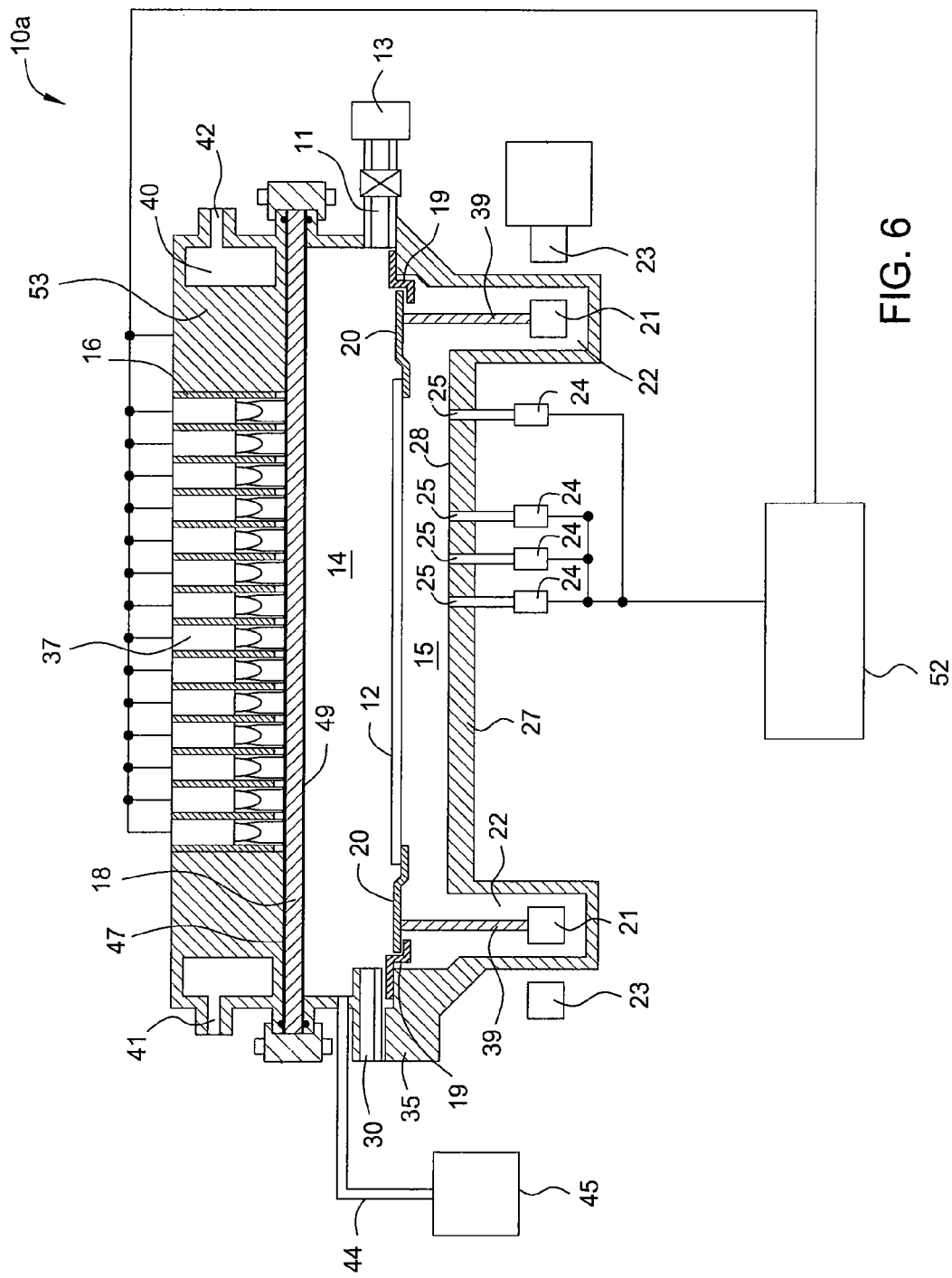
FIG. 6 is a schematic sectional side view of a rapid thermal processing chamber in accordance with another embodiment of the present invention.

FIG. 6 is a schematic sectional side view of a rapid thermal processing chamber 10a in accordance with another embodiment of the present invention. The rapid thermal processing chamber 10a is similar to the rapid thermal processing system 10 of FIG. 5 except no polarizer is disposed near the plurality of thermal probes 24 and the quartz window 18 have two polarizers 47, 49 formed thereon.

In one embodiment, polarize 47, 49 are formed on opposite sides of the quartz window 18 and configured to polarize a selected spectrum of radiant energy along directions perpendicular to one another.

In one embodiment, cooling mechanism may be applied to cool the quartz window 18 which may be heated due to blocked radiant energy by the polarizer 47, 49.

Although the above discussion is focused on measuring substrate temperature in a thermal processing chamber, apparatus and methods of the present invention may be used in any suitable applications to remove background radiation noise from a sampled single in metrology.

While the foregoing is directed to embodiments of the present invention, other and further embodiments of the invention may be devised without departing from the basic scope thereof, and the scope thereof is determined by the claims that follow.

What is claimed is:

1. A chamber for processing a substrate, comprising:
   a chamber enclosure defining a processing volume;
   an energy source configured to direct radiant energy toward the processing volume;
   a substrate support disposed in the processing volume and configured to support the substrate during processing;
   a sensor assembly configured to measure a temperature of the substrate being processed by sensing radiation from the substrate within a selected spectrum; and
   a spectral device positioned between the energy source and the sensor assembly, wherein the spectral device prevents at least one or more wavelengths of the radiant energy from the energy source within the selected spectrum from reaching the sensor assembly.

2. The chamber of claim 1, wherein the spectral device is configured to perform polarizing at least the selected spectrum of the radiant energy from the energy source, reflecting at least the selected spectrum of the radiant energy from the energy source away from the processing volume, absorbing at least the selected spectrum of the radiant energy from the energy source, or combinations thereof.

3. The chamber of claim 1, wherein the spectral device comprises a source polarizer configured to polarize the radiant energy directed to the processing volume along a first direction.

4. The chamber of claim 3, wherein the source polarizer is configured to polarize at least the selected spectrum of the radiant energy from the energy source.

5. The chamber of claim 4, wherein the spectral device further comprises a sensor polarizer configured to polarize radiant energy received by the sensor assembly, wherein the sensor polarizer polarizes the radiant energy along a second direction substantially perpendicular to the first direction.

6. The chamber of claim 3, wherein the polarizer is disposed over a quartz window disposed between the energy source and the processing volume.

7. The chamber of claim 1, wherein the selected spectrum contains one or more wavelengths between about 840 nm to about 960 nm.

8. The chamber of claim 1, wherein the sensor assembly comprises a plurality of pyrometers configured to measure temperature profile across a radius of the substrate.

9. The chamber of claim 1, further comprising a system controller configured to adjust the energy source according to measurement from the sensor assembly.

10. A rapid thermal processing chamber, comprising:
    a chamber enclosure defining a processing volume, wherein the chamber enclosure comprises an energy window transparent to radiant energy;
    an energy source disposed outside the chamber enclosure, wherein the energy source is configured to direct radiant energy towards the processing volume through the energy window;
    a source polarizer configured to polarize the radiant energy directed from the energy source towards the processing volume along a first direction;
    a substrate support disposed in the processing volume and configured to support a substrate during processing;

a sensor assembly configured to measure an attribute of one or more components disposed in the processing volume by sensing radiant energy from the one or more components; and a sensor polarizer configured to polarize radiant energy received by the sensor assembly along a second direction substantially perpendicular to the first direction.

11. The rapid thermal processing chamber of claim 10, wherein the source polarizer comprises a polarizing filter formed on the energy window and configured to polarize a selected spectrum of radiant energy passing through the energy window.

12. The rapid thermal processing chamber of claim 11, wherein the selected spectrum has a wavelength between about 840 nm to about 960 nm.

13. The rapid thermal processing chamber of claim 10, wherein the sensor polarizer is disposed over the sensor assembly.

14. The rapid thermal processing chamber of claim 10, wherein the source polarizer and the sensor polarizer are polarizing filters formed on opposite sides of the energy window.

15. A method for processing a substrate, comprising:
positioning the substrate in a processing volume of a thermal processing chamber having an energy source configured to direct radiant energy towards the processing volume;
measuring an attribute of a component within the processing volume by sensing radiant energy from the component within a selected spectrum using a sensor assembly; and
preventing at least one or more wavelengths of the radiant energy from the energy source within the selected spectrum from reaching the sensor assembly.

16. The method of claim 15, wherein preventing the at least one or more wavelengths of the radiant energy from the energy source within the selected spectrum from reaching the sensor assembly comprises polarizing at least the selected spectrum of the radiant energy from the energy source along a first direction.

17. The method of claim 16, wherein preventing at least one or more wavelengths of the radiant energy from the energy source within the selected spectrum from reaching the sensor assembly further comprises polarizing at least the selected spectrum of the radiant energy along a second direction substantially perpendicular to the first direction.

18. The method of claim 15, wherein preventing at least one or more wavelengths of the radiant energy from the energy source within the selected spectrum from reaching the sensor assembly comprises absorbing at least the selected spectrum of the radiant energy from the energy source.

19. The method of claim 15, wherein preventing at least one or more wavelengths of the radiant energy from the energy source within the selected spectrum from reaching the sensor assembly comprises reflecting the selected spectrum of the radiant energy from the energy source away from the processing volume.

20. The method of claim 15, wherein the selected spectrum has a wavelength between about 840 nm to about 960 nm.

21. The method of claim 15, wherein the attribute of the component comprises a temperature of the substrate.

22. The chamber of claim 1, wherein the spectral device is positioned between the energy source and the substrate support, and wherein the spectral device is configured to treat the radiant energy from the energy source so that at least one or more wavelengths within the selected spectrum do not reach the substrate.

23. A chamber for processing a substrate, comprising:
a chamber enclosure defining a processing volume;
an energy source configured to direct radiant energy toward the processing volume;
a spectral device configured to treat the radiant energy directed from the energy source towards the processing volume;
a substrate support disposed in the processing volume and configured to support the substrate during processing; and
a sensor assembly configured to measure temperature of the substrate being processed by sensing radiation from the substrate within a selected spectrum, wherein the spectral device comprises:
a source polarizer configured to polarize at least the selected spectrum of the radiant energy directed to the processing volume along a first direction; and
a sensor polarizer configured to polarize radiant energy received by the sensor assembly, wherein the sensor polarizer polarizes the radiant energy along a second direction substantially perpendicular to the first direction.

24. A method for processing a substrate, comprising:
positioning the substrate in a processing volume of a thermal processing chamber having an energy source configured to direct radiant energy towards the processing volume;
marking the radiant energy directed from the energy source to the processing volume, wherein marking the radiant energy comprises polarizing the radiant energy from the energy source along a first direction; and
measuring an attribute of a component within the processing volume by sensing radiant energy from the component and eliminating marked radiant energy from the energy source using a sensor assembly, wherein eliminating marked radiant energy comprises polarizing the radiant energy received by the sensor assembly along a second direction substantially perpendicular to the first direction.

25. A method for processing a substrate, comprising:
positioning the substrate in a processing volume of a thermal processing chamber having an energy source configured to direct radiant energy towards the processing volume;
marking the radiant energy directed from the energy source to the processing volume, wherein marking the radiant energy comprises treating a selected spectrum of the radiant energy from the energy source by polarizing the selected spectrum of the radiant energy from the energy source along a first direction; and
measuring an attribute of a component within the processing volume by sensing radiant energy from the component within the selected spectrum and eliminating marked radiant energy from the energy source using a sensor assembly by polarizing radiant energy directed to the sensor assembly within the selected spectrum along a second direction substantially perpendicular to the first direction.

* * * * *